United States Patent [19]

Iga

[11] 4,189,710
[45] Feb. 19, 1980

[54] METHOD AND APPARATUS FOR DETECTING ERRORS IN A TRANSMITTED CODE

[75] Inventor: Akira Iga, Kawasaki, Japan

[73] Assignee: Sony Corporation, Tokyo, Japan

[21] Appl. No.: 904,994

[22] Filed: May 11, 1978

[30] Foreign Application Priority Data

May 18, 1977 [JP] Japan .................................. 52-57281

[51] Int. Cl.² ............................................. G06F 11/12
[52] U.S. Cl. ............................................. 340/146.1 AL
[58] Field of Search ............................... 340/146.1 AL

[56] References Cited

U.S. PATENT DOCUMENTS

| 3,475,724 | 10/1969 | Townsend et al. | 340/146.1 AL |
| 3,544,963 | 12/1970 | Tong | 340/146.1 AL |
| 3,638,182 | 1/1972 | Burton et al. | 340/146.1 AL |
| 4,077,028 | 2/1978 | Lui et al. | 340/146.1 AL |

Primary Examiner—David H. Malzahn
Attorney, Agent, or Firm—Lewis H. Eslinger; Alvin Sinderbrand

[57] ABSTRACT

In code transmission, an information bit has added thereto a first redundant bit which is not evenly divisible by a generation polynomial expression even when all of the information bits are "0" or "1". The code, including the information bits and the first redundant bit, is divided by the generation polynomial expression to provide a second redundant bit as the residue of such division, which is added to the information bit to provide a resultant code which is transmitted. The first redundant bit is added to the received code, which is then divided by the generation polynomial expression to detect the introduction of an error in the transmission path by the existence of a residue of the last division.

An apparatus for accomplishing the above includes a dividing circuit consisting of a shift register having modulo 2 type adding circuits inserted between its adjacent stages in correspondence with constants of a generation polynomial expression and feedback paths extending from the shift register output to the adding circuits, a circuit for adding or presetting the first redundant bit in the shift register stage of the dividing circuit to which an information bit is applied, a circuit for providing the second redundant bit as the residue of a code, divided by the generation polynomial expression, and a circuit for adding the second redundant bit to the information bit, thereby providing the code to be transmitted.

4 Claims, 9 Drawing Figures

FIG 4A $F(x)$
| $a_0, a_1 \cdots a_{n-1}, a_n$ |

FIG 4B

| $F(x)$ | $x^n A(x)$ |

FIG 4C

| $x^{m-1} F(x)$ | $x^{m-1} x^n A(x)$ |

METHOD AND APPARATUS FOR DETECTING ERRORS IN A TRANSMITTED CODE

BACKGROUND OF THE INVENTION

1. Field of the Invention

The present invention relates generally to a code transmission method and apparatus therefor, and is directed more particularly to a code transmission method and apparatus therefor in which, with an error being detected by means of a cyclic redundancy check code, even an error that causes all of the bits of the code to become "0" or "1" can be detected.

2. Description of the Prior Art

Various error detecting methods have been propsoed so that, upon a code transmission, an error in the transmitted code can be detected at the reception stage of the code and the error can be corrected. One of the known methods is the so-called CRC error detecting method which utilizes a cyclic redundancy check code. This method is carried out by, for example, adding a redundant bit to information of n bits length. If the information bits $(a_0, a_1, \ldots a_{n-1})$ of the n's bits are expressed by a polynomial expression $F(x)$, then $$F(x) = a_{n-1}x^{n-1} + a_{n-2}x^{n-2} + \ldots + a_1 x + a_0$$

This polynomial expression $F(x)$ is divided by a generation polynomial expression $G(x)$ and the residue $R(x)$ of such division is added as the redundant bit. This division is effected on a modulo 2 basis, that is, with 2 as its divisor.

The generation polynomial expression $G(x)$ is expressed as follows:

$$G(x) = b_{m-1}x^{m-1} + b_{m-2}x^{m-2} + \ldots + b_1 x + b_0$$

The generation polynomial expression $G(x)$ is seen to be a polynomial expression of $(m-1)$ dimension, while the residue $R(x)$ is a polynomial expression of $(m-2)$ dimension. Thus, the polynomial expression $U(x)$ of a code to be transmitted may be expressed as follows:

$$U(x) = x^{m-1} \cdot F(x) + R(x)$$

In this case, if the quotient in the above division for obtaining the redundant bit is taken as $Q(x)$, then the residue $R(x)$ may be expressed as follows:

$$R(x) = x^{m-1} \cdot F(x) + Q(x) \cdot G(x)$$

The error detection is carried out by dividing the code $U(x)$, which is received at the reception stage, by the generation polynomial expression $G(x)$.

If no error is introduced in the transmission path, the division can be expressed as follows:

$$\frac{U(x)}{G(x)} = \frac{x^{m-1} \cdot F(x) + R(x)}{G(x)} = Q(x)$$

In other words, the received code $U(x)$ can be divided completely by $G(x)$ with no residue, and hence it is discriminated or determined that no error has been caused. On the other hand, in the event that an error is introduced in the transmission path, the polynomial expression of the introduced error pattern may be represented by $E(x)$. In such case, since the code which is received is expressed as $U(x) + E(x)$, the division of this received code by $G(x)$ may be expressed as follows:

$$\frac{U(x) + E(x)}{G(x)} = Q(x) + \frac{E(x)}{G(x)}$$

It will be apparent that, if the polynomial expression $E(x)$ of the error pattern can not be divided by the generation polynomial expression $G(x)$, and, therefore, a residue appears, the existence of an error can be detected from the presence of the residue.

In the above prior art error detecting method using the cyclic redundancy check (CRC) code, the probability that $E(x)$ can be divided by $G(x)$ is about $1/2^m$. Thus, if the power of the generation polynomial expression $G(x)$ is increased, the error detection probability becomes very high.

However, the above prior art error detecting method using the cyclic redundancy check code has a disadvantage in that, even though $U(x) = 0$, the error pattern in the transmission path becomes $U(x) = E(x) = 0$ and, hence, although there is clearly an error, the error can not be detected. In the foregoing case, the following relation is established:

$$\frac{U(x) + E(x)}{G(x)} = \frac{0}{G(x)} = 0$$

That is, $U(x) + E(x)$ is divided by $G(x)$. In fact, an error that results in $U(x) + E(x) = 0$ frequently appears on the transmission path. For example, in the case where a code of the NRZ system is subjected to an FM modulation and thereafter transmitted, if an FM demodulator in the reception stage is the pulse count type, its demodulating level becomes low due to a dropout of the carrier and the received code then becomes "0". Further, in the case when frame synchronization is lost, a period in which no code is present can appear as a period in which a code is present, and similar trouble is encountered.

When an error introduced in the transmission path is only in one direction, for example, the transmitted code becomes all "0"s if the received code is level-inversed and processed by a negative logic to make the above error "1", false operation of the error detecting operation can be prevented. However, it is uncertain that errors will become all "0" or "1", so that the prior art error detecting method can not be said to be effective.

OBJECTS AND SUMMARY OF THE INVENTION

Generally, it is an object of the present invention to provide a novel code transmission method and apparatus therefor which are free from the above-mentioned defects of the prior art.

More particularly, it is an object of the invention to provide a code transmission method which can detect even an error pattern of $U(x) + E(x) = 0$, and further to provide an apparatus for carrying out such method.

According to an aspect of the present invention, a code transmission method comprises providing a first redundant bit which is indivisible by a generation polynomial expression even when all the bits of a code to which said first redundant bit is added are "0" or "1"; dividing a code including an information bit and said first redundant bit by said generation polynomial expression to provide a second redundant bit which is the residue of the division; adding said second redundant bit to said information bit; and transmitting a resultant code. Upon reception of the transmitted code, the first redundant bit is added thereto, and the resultant code is divided by said generation polynomial expression to detect an error.

Further, a code transmission apparatus according to the invention, may employ a dividing circuit which consists of a shift register, adding circuits inserted between adjacent stages of the shift register in accordance with the constants of a generation polynomial expression and feedback paths extending from the output of the shift register to said adding circuits. Further, means are provided for presetting said first redundant bit in said shift register stage of said dividing circuit to which an information bit is applied, and for providing a second redundant bit which is the residue of the division of a code consisting of the information bit and first redundant bit by said generation polynomial expression. Finally, the apparatus has means for adding said second redundant bit to said information bit to provide the code to be transmitted.

The above, and other objects, features and advantages of the invention, will be apparent in the following description of illustrative embodiments which is to be read in conjunction with the accompanying drawings.

BRIEF DESCRIPTION OF THE DRAWINGS

FIGS. 4A to 4E, inclusive, are schematic diagrams to which reference will be made in explaining the invention.

DESCRIPTION OF THE PREFERRED EMBODIMENTS

Figure 1:
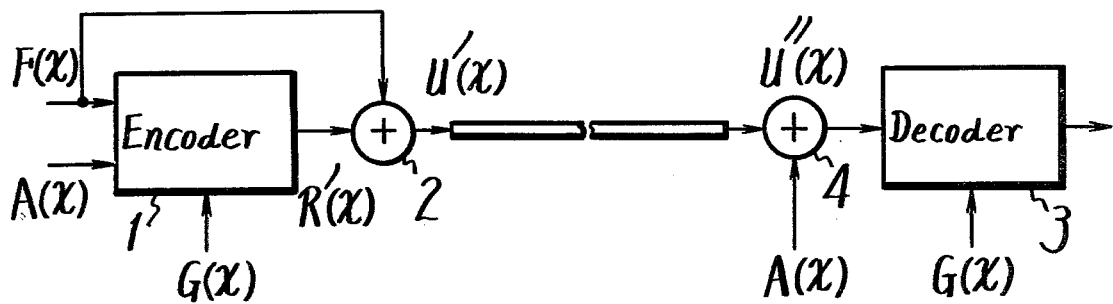
FIG. 1 is a schematic block diagram showing an embodiment of the present invention.

Referring to the drawings in detail and initially to FIG. 1 thereof, it will be seen that, in a code transmission apparatus according to this invention, an encoder 1 is supplied with an information bit $F(x)$, a first redundant bit $A(x)$ and a generation polynomial expression $G(x)$. The encoder 1 provides a second redundant bit $R'(x)$ which is added to information bit $F(x)$ in an adding circuit 2.

An example of the encoder 1 will be described in detail with reference to FIG. 2, in which, reference letters $D_0$ to $D_{m-2}$ designate $(m-1)$ flip-flop circuits which form a shift register. The information bit $F(x)$ is applied to an input terminal 5 and the first redundant bit $A(x)$ is applied to an input terminal 6. The input terminals 5 and 6 are selectively connected through a switch 7 to the shift register so that the latter selectively receives the bit $F(x)$ or $A(x)$. The output of the code transmission apparatus is constituted by a switch 8 which alternately engages an output terminal 9 of the shift register and an output terminal 10 connected directly with the input terminal 5. Though not shown, each of the flip-flop circuits $D_0$ to $D_{m-2}$ which form successive stages of the shift register is supplied with a predetermined clock pulse which is synchronized with the feeding period of the bit $F(x)$ or $A(x)$. At the input sides of the flip-flop circuits $D_0$ to $D_{m-2}$ there are provided $(m-1)$ modulo 2 adders $AD_0$ to $AD_{m-2}$, respectively. The adder $AD_0$ is effective to add, on a modulo 2 basis, that is, by counting to the base 2 without carry, the information bit $F(x)$ received through switch 7 and the respective output bit from terminal 9. The remaining adders $AD_1$ to $AD_{m-2}$ are similarly effective to add, on a modulo 2 basis, the outputs of the preceding stages or flip-flop circuits $D_0, D_1 \ldots D_{m-3}$ and the respective output bit from terminal 9. More particularly, the feedback circuits from output terminal 9 to the adders $AD_{m-2} \ldots AD_1$, $AD_0$ are provided in correspondence with the constants $(b_{m-1}, b_{m-2}, \ldots b_1, b_0)$ of the generation polynomial expression $G(x)$. When the constants are "1", the respective feedback circuits are closed, but when the constants are "0" the respective feedback circuits are opened. The above described circuit or encoder 1 is known in the art as a dividing circuit.

Figure 2:
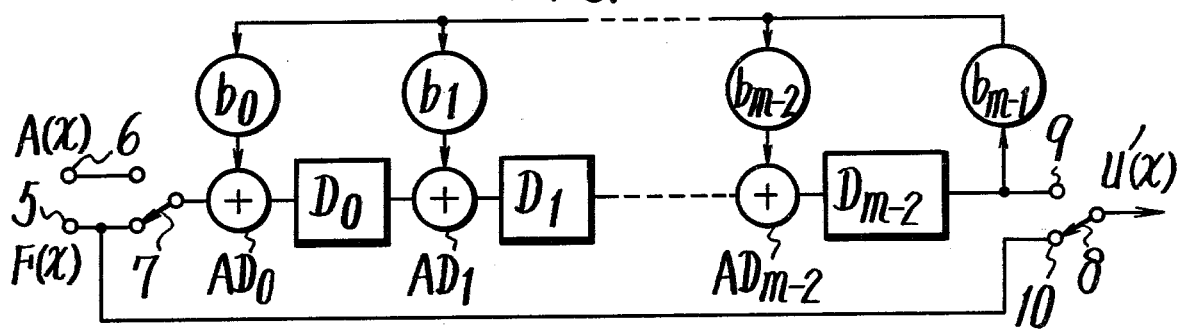
FIG. 2 is a block diagram showing further details of an encoder used in the embodiment of FIG. 1.

In the embodiment of the invention shown on FIG. 2, in place of the information bit $F(x)$, the first redundant bit $A(x)$ may be applied to adder $AD_0$ by means of switch 7. In other words, the first redundant bit $A(x)$ is first applied through switch 7 to the shift register composed of flip-flop circuits $D_0$ to $D_{m-2}$. Immediately after the adding of the redundant bit $A(x)$ is finished switch 7 is changed-over and the information bit $F(x)$ is applied through switch 7 to the shift register to develop the second redundant bit $R'(x)$ at the output terminal 9 of the shift register. Since input terminal 5 for the information bit $F(x)$ is connected to output terminal 10, switch 8 may be selectively changed-over to engage terminals 10 and 9, alternately, with the result that the information bit $F(x)$ and the second redundant bit $R'(x)$ are derived from switch 8 to provide the code $U'(x)$ to be transmitted.

The operation of the above described code transmission apparatus according to this invention will now be described. At first, the information bit $F(x)$ of n bits (FIG. 4A) is added to the first redundant bit $A(x)$, as shown in FIG. 4B. This first redundant bit $A(x)$ is of k bits and is expressed by the following polynomial expression.

$$A(x)=C_{k-1}x^{k-1}+C_{k-2}x^{k-2}+\ldots C_1x+C_0$$

In accordance with the present invention, this polynomial expression $A(x)$ is selected so that, even if all of the information bit $F(x)$ are "0" or "1", the polynomial expression $A(x)$ is indivisible by the generation polynomial expression $G(x)$. Since this first redundant bit $A(x)$ is added to the information bit $F(x)$ at its higher side, the first redundant bit $A(x)$ is multiplied by a factor $x^n$. Next, in order to effect the CRC encoding in a manner similar to the prior art, the information bit $F(x)$ and bit $x^n A(x)$ are each multiplied by a factor $x^{m-1}$, as shown in FIG. 4C, and then they are divided by the generation polynomial expression $G(x)$. The residue of this division is the second redundant bit $R'(x)$ which is expressed as follows:

$$R'(x)=x^{m-1}\{F(x)[+x^nA(x)\}+Q'(x)\cdot G(x)$$

This second redundant bit $R'(x)$ from encoder 1 is added to the information bit $F(x)$ in the adding circuit 2 to provide the code $U'(x)$ to be transmitted (FIG. 4D). This code $U'(x)$ is expressed as follows:

$$U'(x)=x^{m-1}\cdot F(x)+R'(x)$$

After transmission, that is, at the receiving stage, the received code is fed first to an adding circuit 4 in which a first redundant bit similar to that added at the transmitting stage is added to the received code at its higher side, and hence the output U"(x) from adding circuit 4 becomes that shown on FIG. 4E. This output code U"(x) is expressed as follows:

$$U''(x) = x^{m-1}x^n \cdot A(x) + x^{m-1} \cdot F(x) + R'(x)$$

The code U"(x) is fed to a decoder 3 in which the code U"(x) is divided by the generation polynomial expression G(x) to achieve error detection.

If there is no error in the code U"(x), it can be divided by the generation polynomial expression G(x) as below $$\frac{U''(x)}{G(x)} = \frac{U'(x) + x^{m-1}x^n \cdot A(x)}{G(x)} = Q'(x)$$

so that it is determined that no error is present in the code U"(x).

If an error expressed by E(x) is introduced in the transmission path, the division of U"(x) by G(x) results in the following expression:

$$\frac{U''(x)}{G(x)} = \frac{U'(x) + x^{m-1}x^n \cdot A(x) + E(x)}{G(x)} = Q'(x) + \frac{E(x)}{G(x)}$$

In other words, E(x) can not be divided by G(x) and, at such time, the error is detected and decoder 3 produces a detected signal.

If the error introduced in the course of the transmission results in $U'(x) + E(x) = 0$, as set forth previously, the dividing calculation is expressed as follows:

$$\frac{U''(x)}{G(x)} = \frac{x^{m-1}x^n \cdot A(x)}{G(x)}$$

In this case, since the first redundant bit A(x) is selected so that even when the information bits F(x) are all "0" or "1", they can not be divided by the generation polynomial expression G(x), the error can be detected. Similarly, even an error that results in the code U'(x) being all "1"s can be detected.

It is possible that the first redundant bit A(x) be added to the side lower than the lowest bit of the information bits F(x) rather than at the higher side of the information bit, as in the above example.

Figure 3:
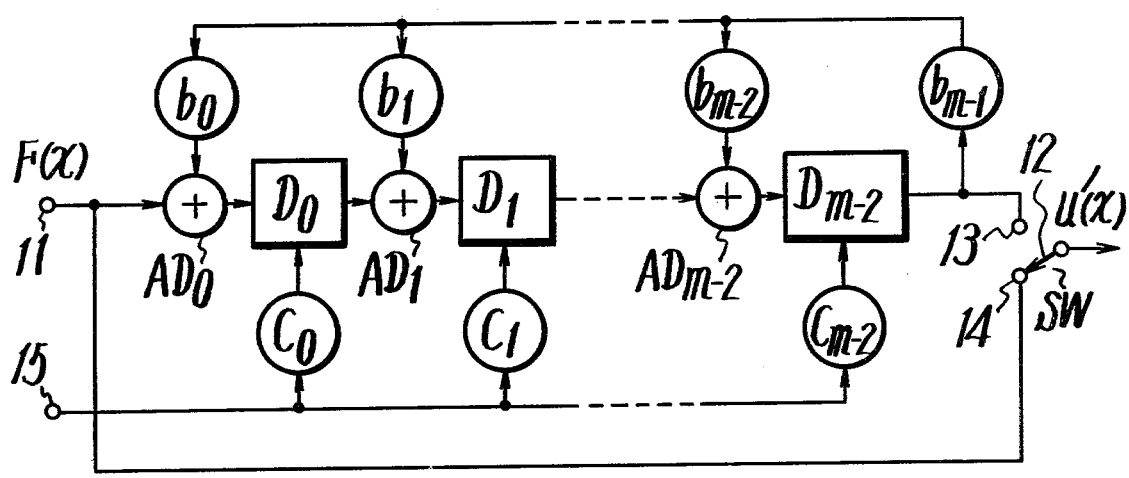
FIG. 3 is a block diagram showing another encoder which is usable in the embodiment of FIG. 1.

Referring now to FIG. 3, it will be seen that, in another example of an encoder 1 which is usable in the code transmission apparatus according to the present invention, an input terminal 11 receives the information bit F(x), and an output switch 12 engages alternately with an output terminal 13 from which the second redundant bit R'(x) is derived or an output terminal 14 which is connected to the input terminal 11. Thus, changeover of twitch 12 between the output terminals 13 and 14 is effective to select the bit R'(x) or F(x), respectively. Further, in the encoder of FIG. 3, an input terminal 15 receives the first redundant bit A(x), and the shift register consisting of flip-flop circuits $D_0$ to $D_{m-2}$ is preset in correspondence with the first redundant bit A(x). The first redundant bit A(x) used in this embodiment also has the bit length of (m−1) and is expressed by the following polynomial expression:

$$A(x) = C_{m-1}x^{m-1} + C_{m-2}x^{m-2} + \ldots + C_1 x + C_0$$

If the constants of the above expression are "1", the corresponding flip-flop circuits $D_0$ to $D_{m-2}$ are preset as "1", whereas, if the above constants are "0", the corresponding flip-flop circuits are preset as "0" i.e. cleared. The information bit F(x) applied to input terminal 11 is delivered without alteration to the output terminal 14. The output terminal 14 and the output terminal 13 of the shift register are alternately engaged by the switch 12, so that either one or the other of the outputs appearing at terminals 13 and 14 is selectively delivered as the output.

A description will now be given of the processing of the signal by the encoder shown on FIG. 3. At first, immediately before the information bits F(x) of the n bit length (FIG. 4A) is applied to the encoder sequentially from $a_n$ in synchronism with the clock pulse, the preset signal is produced so as to preset the first redundant bit A(x) in the flip-flop circuits. When the first redundant bit is preset, the first redundant bit A(x) is added to the higher side of the information bit F(x), as shown on FIG. 4C, and the resultant bits are divided by the generation polynomial expression G(x). If there is a residue of this division, the resulting second redundant bit R'(x), is expressed as follows:

$$R'(x) = x^{m-1}\{F(x) + x^n A(x)\} + Q'(x) \cdot G(x)$$

During the time interval within which the information bit F(x) is fed to terminal 11 of the encoder, the switch 12 is connected to the output terminal 14 to receive the information bit F(x). Thereafter, switch 12 is connected to the output terminal 13 so that the transmission code U'(x) delivered through the switch 12 (FIG. 4D) is expressed as follows:

$$U'(x) = x^{m-1}F(x) + R'(x)$$

The encoder of FIG. 3 processes the n information bits which are applied thereto in the same manner as has been explained just above.

The decoder 3 of FIG. 1 can be formed as a dividing circuit which is similar to the encoder shown in FIG. 2 or FIG. 3. In other words, in the decoder 3, the first redundant bit A(x) may be added to the received code U'(x) before the decoding operation, or the first redundant bit similar to that preset in the encoder of FIG. 3 may be preset in the decoder 3, for example, as in the case of the decoder shown on FIG. 5.

Figure 5:
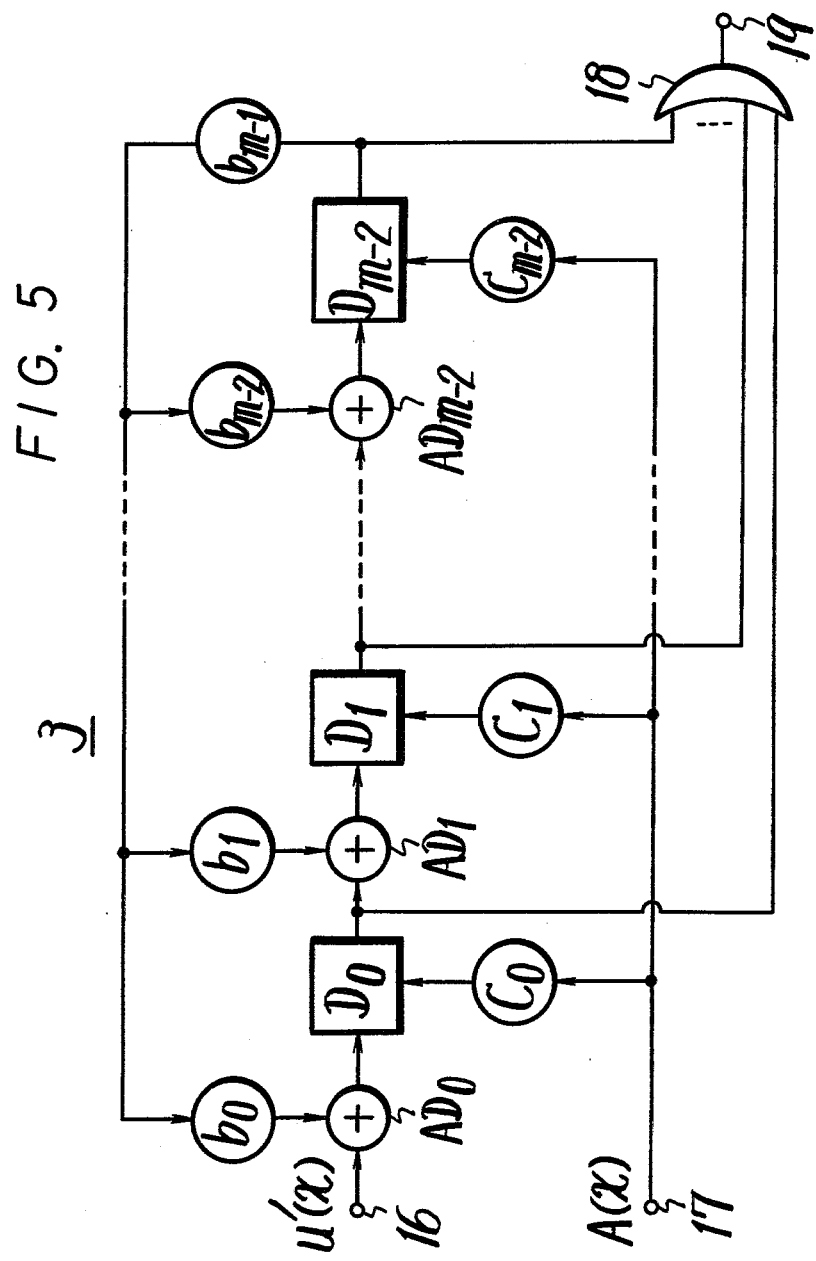
FIG. 5 is a block diagram showing a decoder used in the embodiment of FIG. 1.

In the decoder 3 of FIG. 5, the received code U'(x) is applied to an input terminal 16 for application from the latter to a shift register constituted again by the flip-flop circuits $D_0$ to $D_{m-2}$ and adders $AD_0$, $AD_1$---$AD_{m-2}$. The first redundant bit A(x) is applied to an input terminal 17 for presetting the shift register in a manner similar to that described above for the encoder of FIG. 3. Further, in the decoder of FIG. 5, an OR-circuit 18 is supplied with the outputs from flip-flop circuits $D_0$ to $D_{m-2}$ of the shift register, and an output terminal 19 is led out from OR-circuit 18 to provide the detected output signal. In the case of the decoder of FIG. 5, when the detected output signal at output terminal 19 is "1", an error has been introduced during the code transmission, but when the detected output signal is "0", no error has been introduced.

In the above described embodiments of the present invention, even if an error introduced in the transmission path causes all bit of the transmitted code to become "0" or "1", this error can be detected, so that the present invention can be applied to such a transmission path with great advantage.

Further, in the embodiment of the invention employing the encoder and decoder of FIGS. 3 and 5, respectively, the first redundant bit is added to the information bit by merely presetting the first redundant bit in the shift register of the encoder and decoder, respectively, and therefore, the structures of the encoder and decoder can be substantially the same as in the prior art, but with provision being made for the necessary presetting to achieve the advantageous results of this invention.

Although illustrative embodiments of the invention have been described in detail herein with reference to the drawings, it is to be understood that the invention is not limited to those embodiments, and that various changes and modifications may be effected therein by one skilled in the art without departing from the scope or spirit of the invention as defined in the appended claims.

What is claimed is:

1. A method for detecting errors in a transmitted code comprising the steps of:
   adding to an information bit signal a first redundant bit which is not evenly divisible by a generation polynomial expression even when all of the bits of said information bit signal are "0" or "1";
   dividing the result of said addition of said first redundant bit to said information bit signal by said generation polynomial expression to obtain a second redundant bit as the residue of the division;
   adding said second redundant bit to said information bit signal for providing a resultant code;
   transmitting said resultant code;
   adding said first redundant bit to the transmitted resultant code as received; and
   dividing the received resultant code by said generation polynomial expression to detect an error by the existence of a residue of the last-mentioned division.

2. In apparatus for detecting errors in a transmitted code, which apparatus employs an encoding dividing circuit comprised of a shift register having a plurality of stages, adding circuits interposed between said stages of the shift register in accordance with constants of a generation polynomial expression, and feedback paths from an output of said shift register to said adding circuits; the combination of
   a source of a first redundant bit which is selected so that the resultant of its addition to an information bit signal is not evenly divisible by said generation polynomial expression even when all of the bits of said information bit signal are "0" or "1";
   means for presetting said first redundant bit in said shift register stages and then applying said information bit signal to said shift register so as to obtain said resultant of the addition of the first redundant bit to said information bit signal;
   means for obtaining, at the output of said shift register, a second redundant bit which is the residue of the division of said resultant by said generation polynomial expression; and
   means for adding said second redundant bit to said information bit signal so as to provide a code to be transmitted.

3. Apparatus according to claim 2; in which said means for adding the second redundant bit to the information bit signal includes output switch means having alternate first and second conditions for receiving said second redundant bit and said information bit signal, respectively.

4. Apparatus according to claim 2; which further employs a decoding dividing circuit comprised of a shift register having an input to receive said transmitted code and a plurality of stages, adding circuits interposed between said stages of the decoding shift register in accordance with said constants of the generation polynomial expression, and feedback paths from an output of said decoding shift register to the respective adding circuits; and in which said decoding dividing circuit further includes means for presetting said first redundant bit in the decoding shift register stages prior to the application thereto of the received code, and OR means connected to said stages of the decoding shift register to obtain therefrom any residue of the division by said generation polynomial expression of the resultant of the addition of said first redundant bit to the received code, which last-mentioned residue is an indication of the introduction of error in the received code during the transmission thereof.

* * * * *